United States Patent [19]
Kimura

[11] Patent Number: 5,815,450
[45] Date of Patent: Sep. 29, 1998

[54] SEMICONDUCTOR MEMORY DEVICE

[75] Inventor: Takemi Kimura, Tokyo, Japan

[73] Assignee: NEC Corporation, Tokyo, Japan

[21] Appl. No.: 601,855

[22] Filed: Feb. 15, 1996

[30] Foreign Application Priority Data

Feb. 17, 1995 [JP] Japan .................................. 7-053270

[51] Int. Cl.$^6$ ............................................. G11C 7/00
[52] U.S. Cl. ............................................ 365/203; 365/208
[58] Field of Search ........................... 365/203–207, 365/208, 189.07, 210, 185.25

[56] References Cited

U.S. PATENT DOCUMENTS

| | | | |
|---|---|---|---|
| 5,040,148 | 8/1991 | Nakai | 365/185.25 |
| 5,245,574 | 9/1993 | Frary | 365/203 |
| 5,381,374 | 1/1995 | Shiraishi | 365/185.25 |
| 5,404,325 | 4/1995 | Shibata | 365/203 |
| 5,430,672 | 7/1995 | Kuwabara | 365/203 |
| 5,559,737 | 9/1996 | Tanaka | 365/185.25 |

FOREIGN PATENT DOCUMENTS

| | | |
|---|---|---|
| 492293 | 3/1992 | Japan . |
| 4252497 | 9/1992 | Japan . |

Primary Examiner—A. Zarabian
Attorney, Agent, or Firm—Whitham, Curtis & Whitham

[57] ABSTRACT

A semiconductor memory device having memory cells and digit lines connected to the memory cells, a precharger precharging the digit lines of the memory cells to a dropped voltage, a memory cell selector selecting one of the memory cell, a sense amplifier comparing a level of the digit line of the selected memory cell with a reference level to read out data. The dropped voltage is applied to the memory cells to disuse a current detection part of a conventional sense amplifier, resulting in miniaturization of the memory device.

9 Claims, 7 Drawing Sheets

SEMICONDUCTOR MEMORY DEVICE

BACKGROUND OF THE INVENTION

The present invention generally relates to a semiconductor memory device and particularly, to a read circuit of a mask ROM whose elements are miniaturized and are adapted to high capacity.

DESCRIPTION OF THE RELATED ART

During recent years, miniaturization of elements has developed and a memory capacity of a mask ROM or the like has markedly increased.

Figure 1:
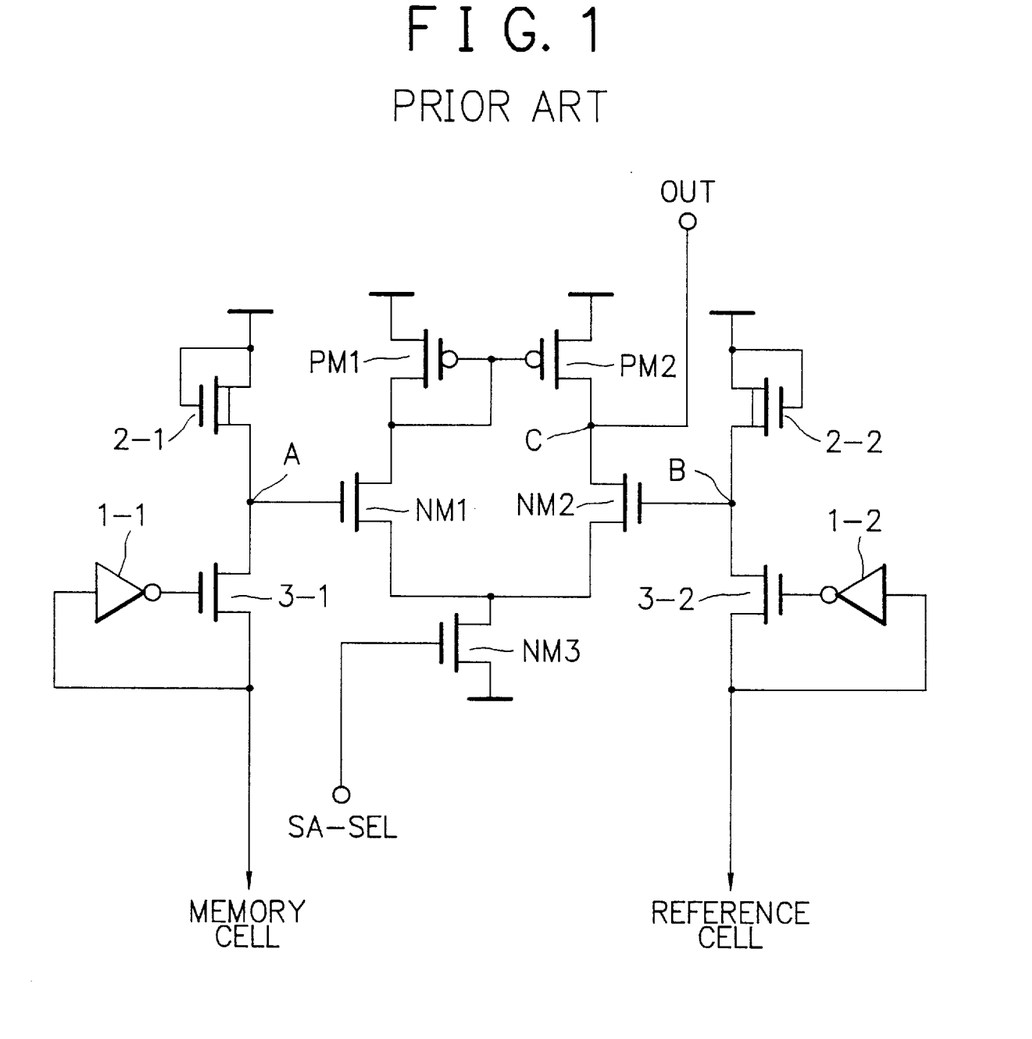
FIG. 1 is a circuit diagram of a conventional sense amplifier.

In a conventional mask ROM, its read circuit, as shown in FIG. 1, is a current detection sense amplifier wherein whether or not current flows in a memory cell is discriminated by comparing a voltage drop at a node A with a reference voltage (a first conventional example).

More specifically, in FIG. 1, the read circuit comprises an n-channel transfer transistor (transfer gate) 3-1 connected to a memory cell (not shown), a load transistor 2-1 composed of a depletion n-channel MOS transistor, an inverter (read circuit) 1-1, two n-channel MOS transistors NM1 and NM2 constituting a differential pair, and two p-channel MOS transistors PM1 and PM2 which constitute a current mirror circuit and function as an active load of the differential pair. An n-channel MOS transistor NM3 is arranged between the coupled sources of the MOS transistors NM1 and NM2 and ground and inputs a sense amplifier activation signal SA-SEL from its gate and acts as a constant-current source. The differential amplifier picks up an output from a node C (the connection between the output terminal of the current mirror circuit and the drain of the MOS transistor NM2) The FIG. 1 read circuit also includes an n-channel transfer gate 3-2 connected to a reference cell (not shown), a load transistor 2-2 composed of a depletion n-channel MOS transistor, and an inverter (reference voltage generator circuit) 1-2.

At the input terminals of the differential amplifier, that is, the gates of the two nMOS transistors NM1 and NM2, two nodes are connected, that is, a node A as a data input terminal, the connection between the load transistor 2-1 and the transfer gate 3-1 and a node B as a reference voltage input terminal, the connection between the load transistor 2-2 and the transfer gate 3-2.

At the reading of the memory cell, a digit (hereafter referred to as "bit") line is precharged to a predetermined high voltage, thus making a word line of the selected memory cell a high level.

For example, when the selected memory cell is nonconductive, the voltage of the digit line coupled with the transfer gate 3-1 is not dropped and thus the output of the inverter 1-1 is low. As a result, transfer gate 3-1 is nonconductive. Hence, since the depletion load transistor 2-1 is nonconductive, the node A is pulled up to a voltage close to a power source voltage Vcc.

Then, when the selected memory cell is conductive, the voltage of the bit line connected to the transfer gate 3-1 drops and the output of the inverter 1-1 goes high level.

Thus, the transfer gate 3-1 becomes conductive and the voltage at the node A drops.

A voltage of the output of the reference circuit (at the node B), for example, is set so as to be an intermediate voltage between the voltage at the node A when the selected memory cell is nonconductive and the voltage at the node A when the selected memory cell is conductive.

The differential amplifier amplifies and outputs the difference voltage between the voltage at the node A and the reference voltage to read out the data written in the memory cell. In this case, the reference cell (not shown) has nearly the same construction as the memory cell.

On the other hand, a nonvolatile memory device has been proposed in order to achieve low consumption power and high integration without sacrificing operation speed, as disclosed in the Japanese Patent Laid-Open Publication No. 4-92293 (second conventional example).

In this second conventional example, a sense amplifier and an address decoder are operated by a relatively low voltage applied from a driver circuit and the other circuits are operated by a power source voltage supplied from the outside.

Further, a nonvolatile semiconductor memory device has been proposed, as disclosed in the Japanese Patent Laid-Open Publication No. 4-252497 (third conventional example).

In this third conventional example, an internal low voltage circuit generates a predetermined lower voltage than a power source voltage and another power source supplying a dropped voltage is used for a load transistor of a sense amplifier. And, a voltage change of the load transistor is detected by the differential (sense) amplifier to read out information of a memory cell.

In the mask ROM, the request for high integration and high memory density of the system is strong. Further, in order to implement a large capacity device, memory cells occupying the greater part of the device area have been miniaturized and the size of the elements (transistors) constituting the memory cells has been markedly diminished.

Accordingly, in order to ensure the reliability of the elements, it is required to design the sense amplifier and the like so that excessive stress may not be given to the drains of the elements (transistors) constituting the memory cells (to be designed so that usually a voltage of 2V or so may be applied). Hence, the sense amplifier described above in the first conventional example has been used in the mask ROM.

However, in the first conventional example, it is considered that the transfer gate 3-1 connecting the bit line of the memory cell and the load transistor 2-1, the inverter 1-1 to detect the voltage of the bit line and to produce a signal to be fed back to the gate of the transfer gate 3-1, and the load transistor 2-1 are required to have sufficient ability (driving ability), respectively.

As a result, the area of the sense amplifier comes to be very large.

Moreover, in the first conventional example, the correct information can be read out only after the very large parasitic capacity added to the bit line is charged in the current detection part and hence it is difficult to attain high speed operation.

On the other hand, in an EPROM disclosed in the Japanese Patent Laid-Open Publication No. 4-92293, each memory cell transistor has a double gate structure composed of a floating gate and a control gate.

When the memory cell transistors are operated at a low voltage, the ability of the memory cell transistors is not sufficient. Hence, the voltage to be applied to the control gates of the memory cell transistors is set to the same voltage as the external voltage so as to increase the current drive ability of the memory cell transistors.

However, even when the low voltage power source is used for only the amplifier part of the sense amplifier, the foregoing problem can not be solved. And, when the voltage of the power source for the current detection part further drops, the ability for charging up the parasitic capacitance of the bit lines becomes insufficient, which effects a large speed drop.

Furthermore, in the Japanese Patent Laid-Open Publication No. 4-252497, although the low voltage power source is connected to the load transistor of the sense amplifier, the dropped voltage is added to the power source of the load transistor and hence the charge-up ability of the bit line is reduced. As a result, a larger area is required and it gives a reduced operation speed.

The present invention has been achieved with such points in mind.

SUMMARY OF THE INVENTION

It therefore is an object of the present invention to provide a semiconductor memory device in view of the aforementioned problems of the prior art, which is capable of applying a dropped voltage to memory cells to eliminate a current detection part of the memory cells requiring a large area, and thereby attain a miniaturized memory device and a high speed operation.

In accordance with one aspect of the present invention, there is provided a semiconductor memory device having memory cells and bit lines connected to the memory cells, the semiconductor memory cell device comprising low voltage means for producing a dropped voltage from a power source voltage supplied from outside, precharge means connected to the low voltage means and the memory cells through the bit lines for precharging the bit lines of the memory cells to the dropped voltage, selection means connected to the memory cells for selecting one of the memory cells after the precharge of the bit lines, and a sense amplifier connected to the memory cells through the bit lines for comparing a level of the bit line of the selected memory cell with a reference level to read out data written in the selected memory cell.

In the present invention, preferably, the precharge means may precharge the bit lines to the dropped voltage on the basis of a pulse signal produced by detecting a change of an input signal.

Further, in the present invention, a reference level generator may generate the reference level to be sent to the sense amplifier.

Moreover, in the present invention, preferably, a second precharge means connected to the low voltage means may precharge a bit line of a reference cell connected to the second precharge means through the bit line, and a voltage of the precharged bit line of the reference cell may be sent to the sense amplifier as the reference level. In this case, the sense amplifier may preferably include a latch means for holding the read-out data.

Still further, the semiconductor memory device may preferably be a mask ROM.

Yet further, according to the invention, there is provided a mask ROM type semiconductor memory device wherein bit lines of memory cells are precharged to a potential level to which an externally supplied power supply voltage is internally reduced, before selecting one of the memory cells, and wherein one of the bit lines corresponding to the selected memory cell is connected to a sense amplifier for comparing a potential level of the corresponding bit line with a reference level to have a data read therefrom.

According to the present invention, in the semiconductor memory device of the present invention, bit lines of memory cells are precharged to a dropped voltage by means of a pulse produced by detecting a change of an input signal and the change of the level of the bit lines is compared with a reference level to read out data.

Hence, a layout of a sense amplifier having a small area can be carried out without giving any excessive stress to the memory cells and which is advantageous to high speed operation of the device.

Further, according to the present invention, in the semiconductor memory device, a bit line of a reference cell is precharged to the dropped voltage in the same manner as the memory cells and current is applied to the reference cell to generate a reference voltage.

A data latch type sense amplifier is used to achieve much faster operation speed.

BRIEF DESCRIPTION OF THE DRAWINGS

The objects, features and advantages of the present invention will become more apparent from the consideration of the following detailed description, taken in conjunction with the accompanying drawings, in which.

DETAILED DESCRIPTION OF THE PREFERRED EMBODIMENTS

There will be a detailed description below of the preferred embodiments of the invention, with reference to the accompanying drawings. Like members are designated with like reference characters for a facilitated comprehension.

Figure 2:
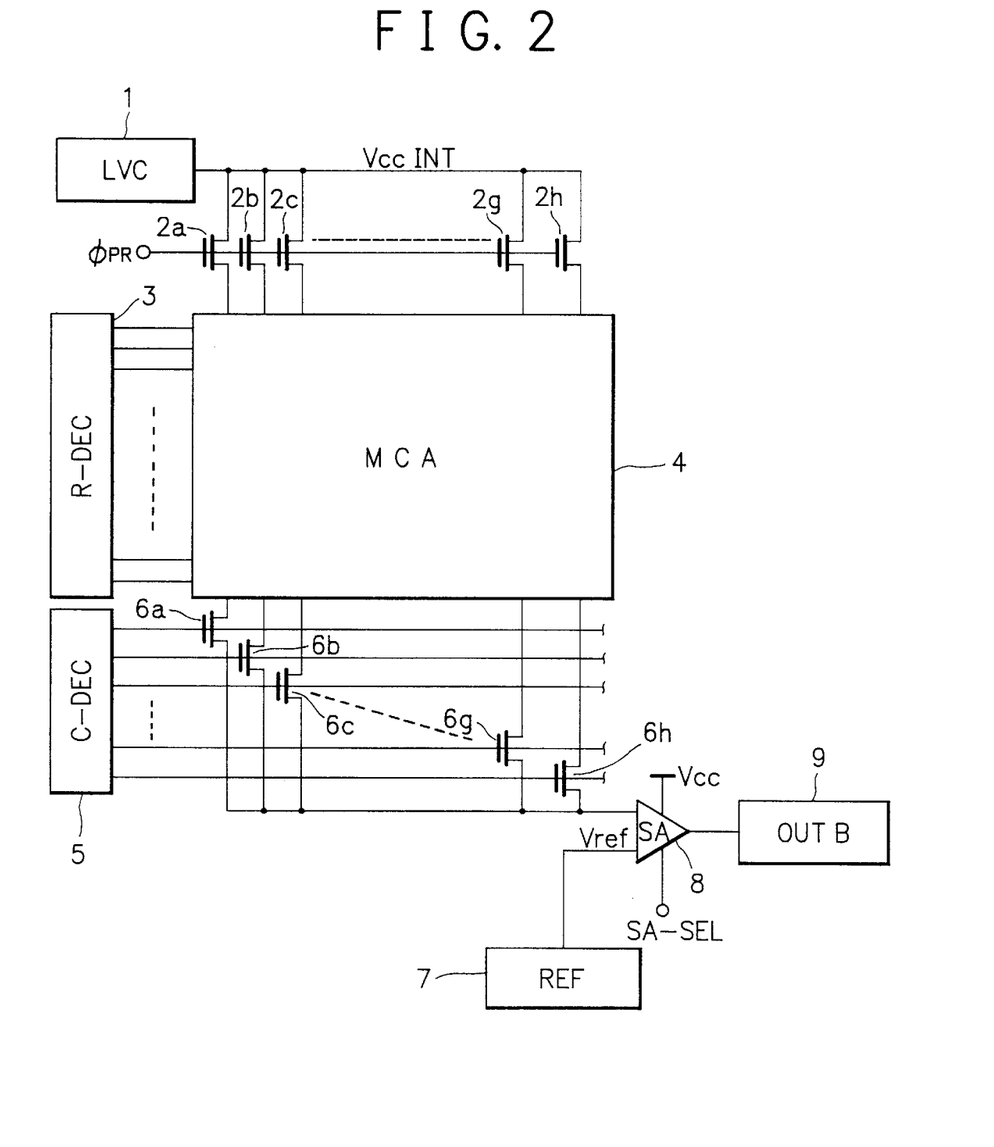
FIG. 2 is a block diagram of a semiconductor memory device according to the first embodiment of the present invention.

FIG. 2 shows a semiconductor memory device according to the first embodiment of the present invention.

In FIG. 2, the semiconductor memory device comprises a low voltage circuit 1 supplying a dropped voltage, precharge transistors 2a to 2h, a row decoder 3, a memory cell array 4, a column decoder 5 selection transistors 6a to 6h for selecting respective bit lines of the memory cell array 4, a reference voltage generator 7, a sense amplifier 8 and an output buffer 9.

As shown in FIG. 2, of the precharge transistors 2a to 2h, the drains are connected in common to the output of the low voltage circuit 1 and the sources are coupled with respective bit lines of the memory cell array 4 while a precharge pulse φPR is input to the gates.

Further, of the selection transistors 6a to 6h, the drains are coupled with the respective bit lines of the memory cell array 4 and the sources are connected in common to one input terminal of the sense amplifier 8 while the gates are linked to respective selection signal lines of the column decoder 5.

An output voltage Vref of the reference voltage generator 7 is input to the other input terminal of the sense amplifier 8.

In FIG. 2, a dropped voltage VccINT output from the low voltage circuit 1 is applied to the bit lines of the memory cell array 4 via the precharge transistors 2a to 2h.

That is, the precharge transistors 2a to 2h are turned on by the precharge pulse φPR produced by detecting the change of an input signal such as an address signal or a control signal so as to precharge the bit lines to the predetermined level of the voltage VccINT.

The level of VccINT is preferably determined to approximately 2V considering the problem of reliability of the memory cells and the like.

Then, after the precharge, one word line is selected by the row decoder 3 and one of the selection transistors 6a to 6h is selected by the column decoder 5, thus selecting one bit line to be connected to the sense amplifier 8.

Next, a sense amplifier activation signal SA-SEL is applied to the sense amplifier 8 in order to activate the sense amplifier 8 and the sense amplifier 8 compares a reference voltage Vref output from the reference voltage generator 7 with the level of the selected bit line to read out the data written in the memory cell. The read-out data are fed to the output buffer 9.

Figure 3:
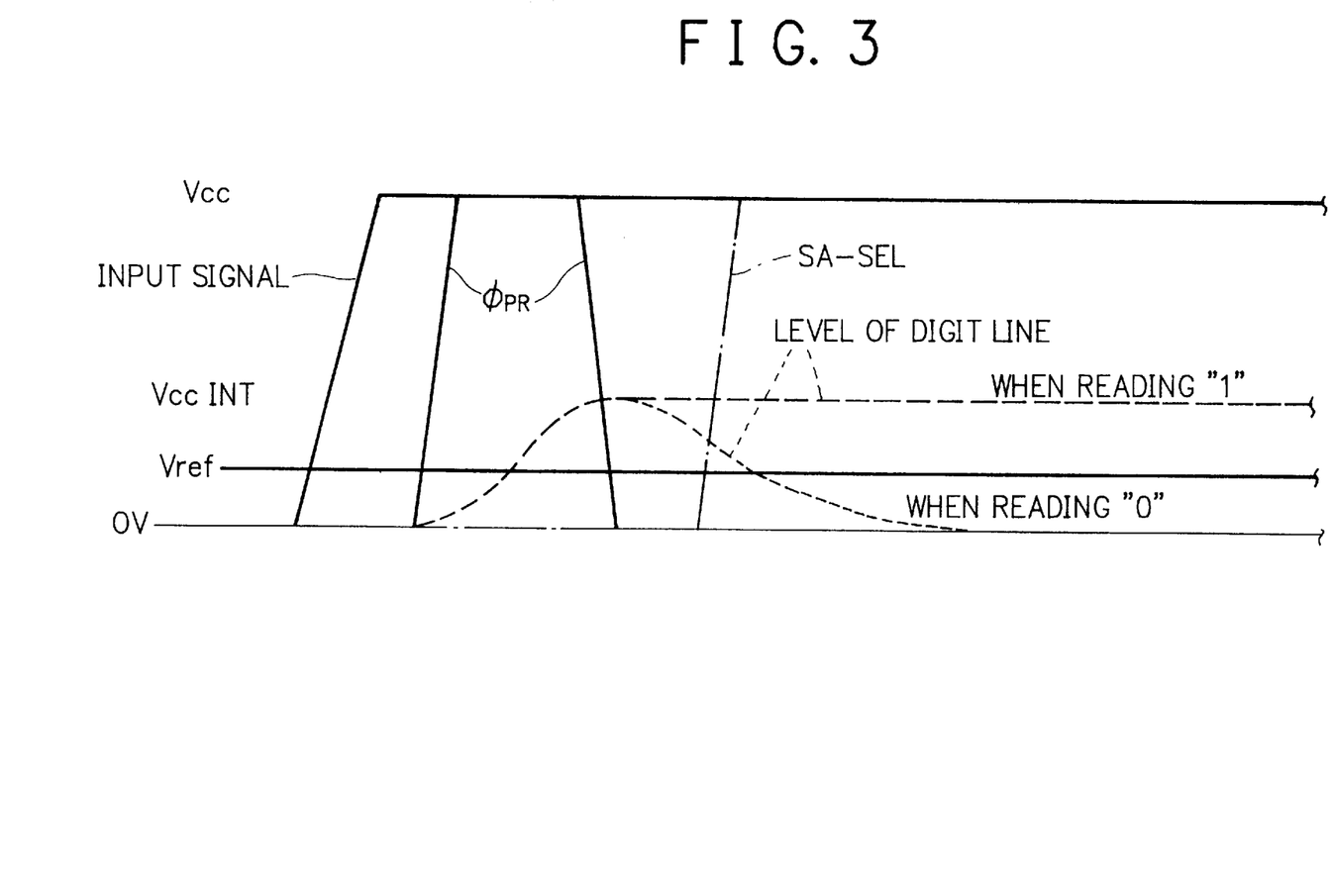
FIG. 3 is a time chart showing the operation of the semiconductor memory device shown in FIG. 2.

FIG. 3 shows a time chart of signals at the reading in this embodiment.

As shown in FIG. 3, as the precharge pulse φPR turns active on the basis of the change of the input signal such as the address signal or the like, the voltage of the bit lines rise up to the voltage VccINT.

When the selected memory cell stores, for example, "1", with the high level of the word line, the memory cell is nonconductive and the bit line does not drop.

When the selected memory cell stores, for example, "0", with the high level of the word line, the memory cell is conductive and the bit line drops.

Thus, at the time when the sense amplifier activation signal SA-SEL changes to a high level (Vcc), the sense amplifier 8 makes a comparison between the voltage of the bit line and the reference voltage Vref.

Figure 4:
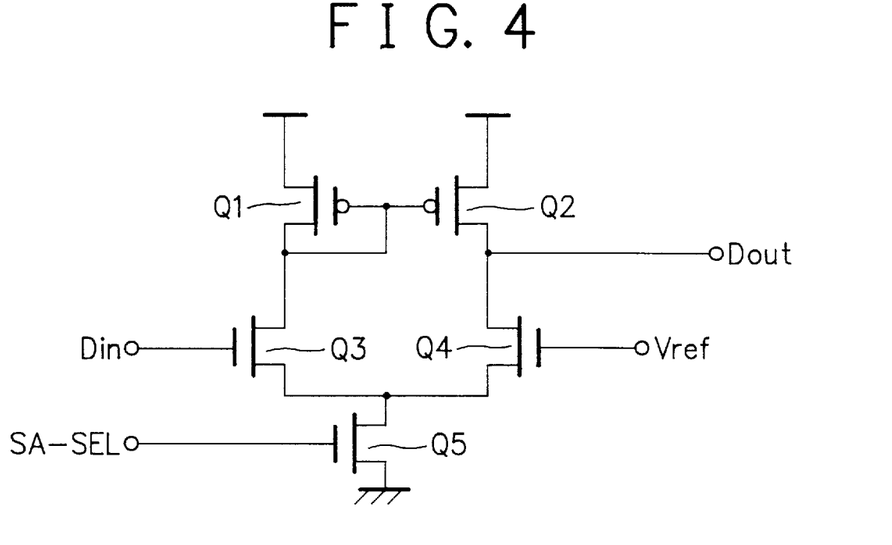
FIG. 4 is a circuit diagram of a sense amplifier shown in FIG. 2.
Figure 5:
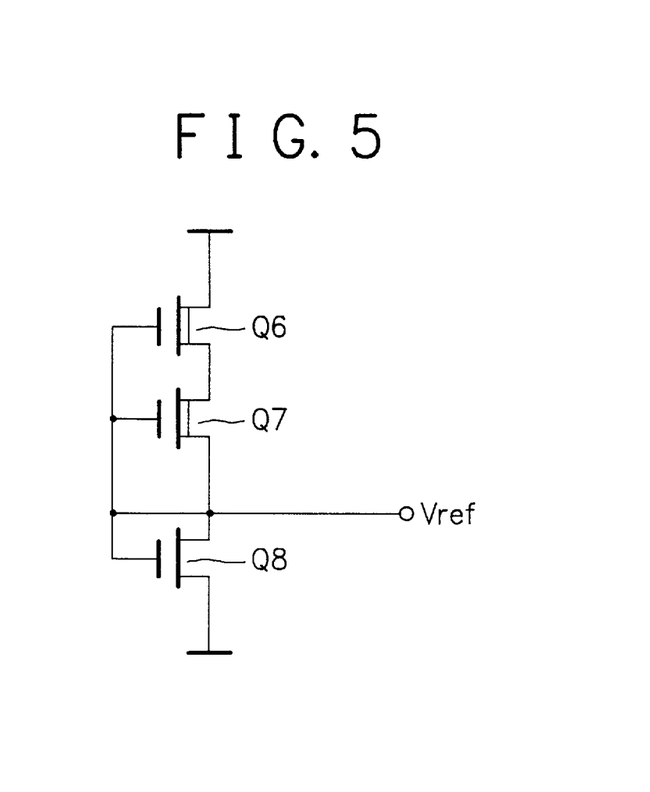
FIG. 5 is a circuit diagram of a reference voltage source shown in FIG. 2.

FIG. 4 shows one example of the sense amplifier 8 in this embodiment, and FIG. 5 shows one example of the reference voltage generator 7 in this embodiment.

As shown in FIG. 4, the sense amplifier 8 comprises a pair of n-channel MOS transistors Q3 and Q4 constituting a differential pair, a pair of p-channel MOS transistors Q1 and Q2 which constitute a current mirror circuit and function as an active load of the differential pair, and an n-channel MOS transistor which inputs the sense amplifier activation signal SA-SEL from its gate and functions as a constant-current source of the differential pair.

The data, that is, the voltage of the bit line selected by the selection transistors 6a to 6h, is input to the gate of the nMOS transistor Q3 and the reference voltage Vref to the gate of the nMOS transistor Q4.

The connection between the drains of the pMOS transistor Q2 and the nMOS transistor Q4 is coupled with an output terminal Dout.

As shown in FIG. 5, the reference voltage generator 7 comprises two depletion n-channel MOS transistors Q6 and Q7 connected in series between the power source and the ground, and an enhancement n-channel MOS transistor Q8.

The gates of these three transistors Q6, Q7 and Q8 are connected in common to the connection point between the source of the transistor Q7 and the drain of the transistor Q8. The reference voltage Vref is output from this connection point, i.e., the drain of the nMOS transistor Q8.

In this embodiment, the voltage to be applied to the memory cell transistors is the dropped voltage VccINT and no current detection circuit of the conventional example is required. Only the precharge transistors 2a to 2h occupying a small area are added around the memory cell array 4.

Hence, the sense amplifier heretofore requiring a large area can be diminished and the small sense amplifier contributes to the miniaturization of the whole device.

In the embodiment, it is readily understood that, if the present semiconductor memory device is applied to devices requiring a lot of sense amplifiers in a page mode or a burst mode, marked advantages can be obtained.

Further, in this embodiment, the parasitic capacitance of the bit lines is previously charged prior to the reading and thus the data can be read out at high speed.

Figure 6:
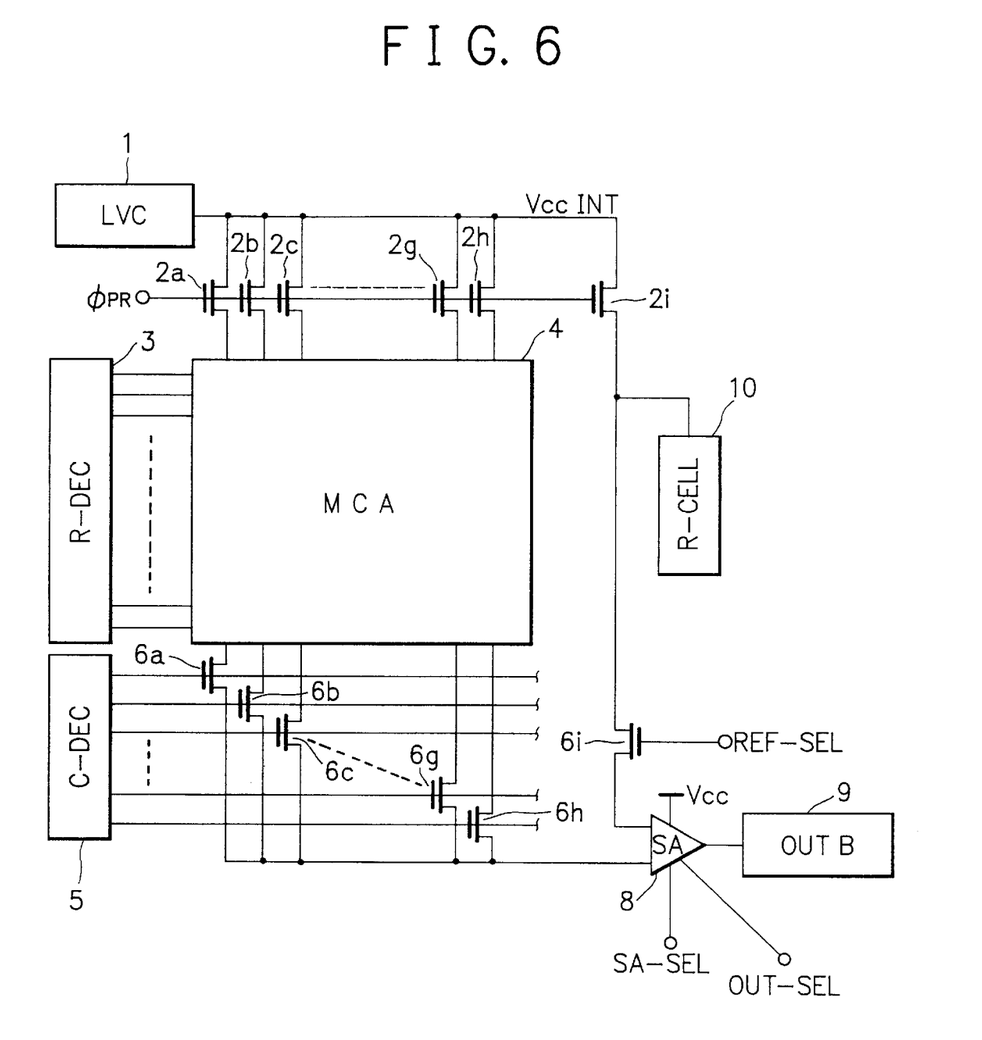
FIG. 6 is circuit diagram of a block diagram of a semiconductor memory device according to the second embodiment of the present invention.
Figure 7:
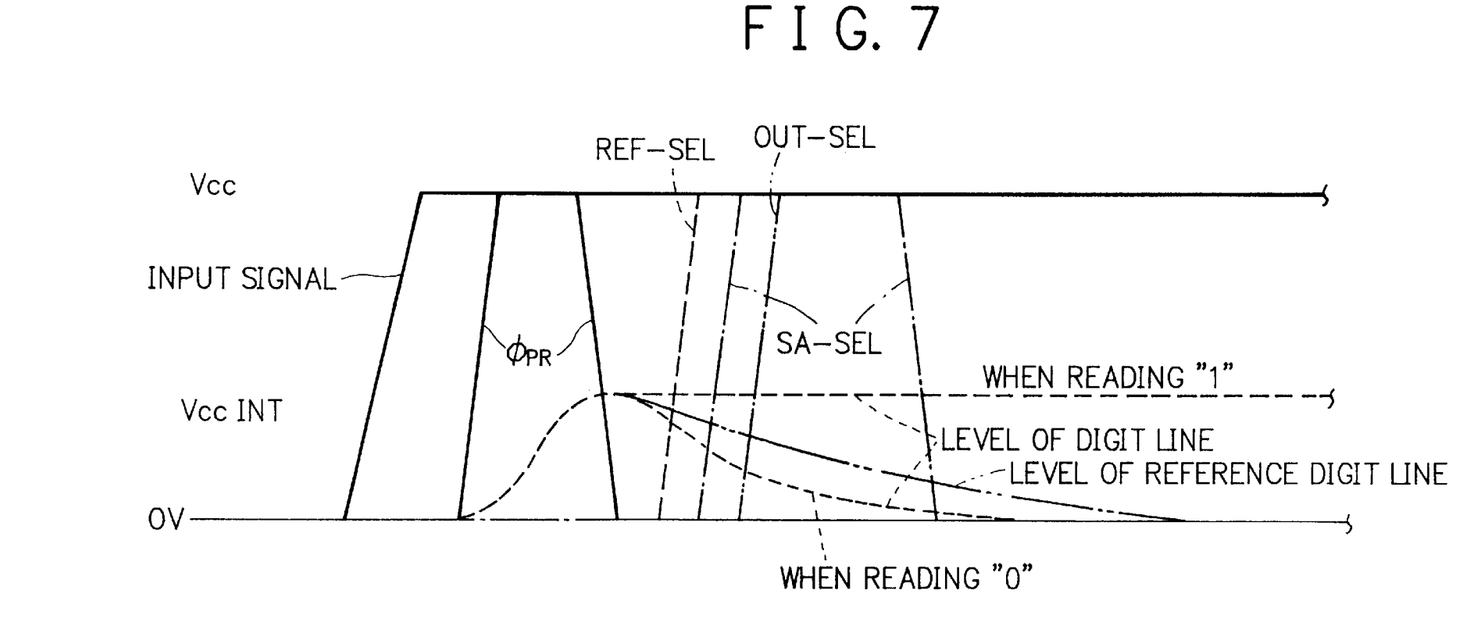
FIG. 7 is a time chart showing the operation of the semiconductor memory device shown in FIG. 6.
Figure 8:
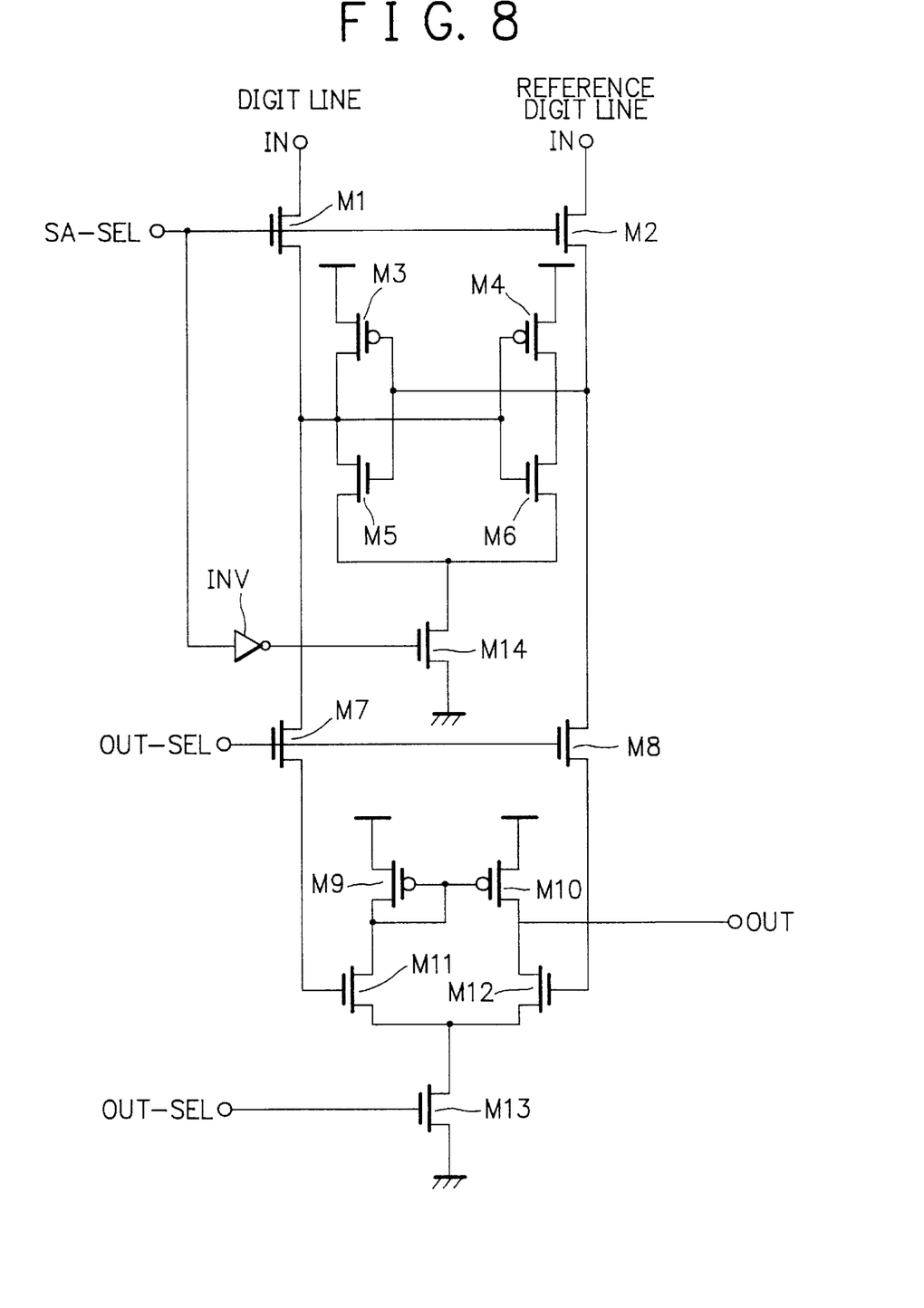
FIG. 8 is a circuit diagram of a sense amplifier shown in FIG. 6.

FIG. 6 shows a semiconductor memory device according to the second embodiment of present invention. FIG. 7 is a time chart showing the operation of the semiconductor memory device of FIG. 6, and FIG. 8 shows one example of the sense amplifier of the semiconductor memory device of FIG. 6.

In this embodiment, as shown in FIG. 6, the construction of the semiconductor memory device is similar to that of the first embodiment shown in FIG. 2, except that a reference cell 10, another precharge transistor 2i for the reference cell 10, and a reference selection transistor 6i for selecting the bit line of the reference cell 10 are included.

The reference voltage generator 7 of the first embodiment is omitted. Hence, the detailed description of the same parts as those in the first embodiment shown in FIG. 2 can be omitted for brevity.

In FIG. 6, as to the precharge transistor 2i, the drain is connected to the output of the low voltage circuit 1 and the source to the bit line of the reference cell 10 while a precharge pulse φ PR is input to the gate.

Concerning the reference selection transistor 6i, the drain is connected to the source of the precharge transistor 2i and the source is connected to the other input terminal of the sense amplifier 8 while a reference selection signal REF-SEL is input to the gate.

Further, a sense amplifier activation signal SA-SEL and an output control signal OUT-SEL are input to the sense amplifier 8.

As shown in FIG. 6, in this embodiment, by using the reference cell 10 having similar construction and form to the memory cell, the bit line of the reference cell 10 is precharged in the same manner as the memory cell and current is applied to the reference cell 10 to produce the level of the reference voltage.

In this embodiment, the reference cell 10 is designed so that the level of its bit line may be half the level of the memory cell when the current flows in the memory cell.

Moreover, the data are required to be held in the sense amplifier 8 or the output buffer 9 and a latch type sense amplifier is used.

As shown in FIG. 7, as the precharge pulse φPR turns active on the basis of the change of the input signal such as the address signal or the like, the voltage of the bit lines including the bit line of the reference selection transistor 6*i* rise up to the voltage VccINT.

When the selected memory cell stores, for example, "1", with the high level of the word line, the memory cell is nonconductive and the bit line does not drop.

On the other hand, when the selected memory cell stores, for example, "0", with the high level of the word line, the memory cell is conductive and the bit line drops. The reference sell 10 is also conductive and the bit line of the reference selection transistor 6*i* starts to drop.

Thus, the reference selection signal REF-SEL turns active and the reference selection transistor 6*i* becomes conductive. Then, the sense amplifier activation signal SA-SEL turns active.

Hence, the voltage of the bit line of the reference cell 10 as the reference voltage Vref is input to the other input terminal of the sense amplifier 8 and the voltage of the bit line of the selected memory cell as the data input is also input to one input terminal of the sense amplifier 8.

Then, the sense amplifier 8 makes a comparison. At the time when the output control signal OUT-SEL changes active, the sense amplifier 8 outputs the data.

In this embodiment, the voltage drop of the bit line of the reference cell 10 is slower than that of the memory cell holding the data of "0", and the reference voltage Vref is kept higher than the voltage of the bit line of the memory cell holding the data of "0", to ensure a certain margin.

In this embodiment, the operation timing and the like are somewhat complicated compared with the first embodiment. However, the level of the reference voltage and the level of the bit lines start from the same value VccINT precharged and thus this embodiment is further advantageous to higher speed operation.

As shown in FIG. 8, the sense amplifier 8 shown in FIG. 6 comprises first and second sense amplifier units.

The first sense amplifier unit includes a pair of n-channel MOS transistors M1 and M2 which are connected to input lines such as a bit line and a reference bit line and which input the sense amplifier activation signal SA-SEL at their gates, a first inverter composed of a p-channel MOS transistor M3 and an n-channel MOS transistor M5, and a second inverter composed of a p-channel MOS transistor M4 and an n-channel MOS transistor M6, the first and second inverters constituting a flip-flop by coupling their inputs and their outputs together.

The first sense amplifier further includes an n-channel MOS transistor M14 connected between the common connection of the sources of the n-channel MOS transistors M5 and M6 and the ground, and an inverter INV through which the sense amplifier activation signal SA-SEL is input to the gate of the n-channel MOS transistor M14.

The second sense amplifier unit for amplifying the output of the first sense amplifier unit includes a differential amplifier composed of a differential pair of transistors M11 and M12, a current mirror circuit M9 and M10 and an n-channel MOS transistor 13 functioning as a constant-current source, and a pair of n-channel MOS transistors M7 and M8 which are connected to the input ends of the differential amplifier and to the input lines such as the bit line and the reference bit line and which input the output control signal OUT-SEL from their gates.

The output control signal OUT-SEL is also input to the gate of the n-channel MOS transistor 13. The differential amplifier outputs the data through the connection between the transistors M10 and M12.

The operation of the sense amplifier 8 shown in FIG. 8 will be described.

When the sense amplifier activation signal SA-SEL is active, the nMOS transistors M1 and M2 are on and the voltages of the bit line and the reference bit line are input to the first sense amplifier unit (flip-flop).

When the output control signal OUT-SEL turns active (high level), the constant-current source M13 operates and the differential amplifier (second sense amplifier unit) differentially amplifies the output of the first sense amplifier unit and outputs the amplified data.

Then, when the sense amplifier activation signal SA-SEL changes from active to inactive, the nMOS transistors M1 and M2 are turned off and hence the bit line and the reference bit line are separated from the first sense amplifier unit.

The nMOS transistor M14 is conductive and the output of the flip-flop substantially constituting the first sense amplifier unit changes so as to output the voltage corresponding to a logic value (for example, operates so as to output 0V when the bit line is 1.0V or to raise to the power source voltage Vcc level when the reference bit line is 1.5V).

In FIG. 8, in the first sense amplifier unit, the nMOS transistor 14 and the inverter INV are provided for stabilizing the operation.

Hence, the sources of the nMOS transistors M5 and M6 may be directly connected to the ground.

Although the present invention has been described in connection with a mask ROM in the above embodiments, the present invention can be applied to a read circuit of semiconductor memory devices except the aforementioned semiconductor memory devices.

As described above, in the semiconductor memory device of the present invention, bit lines of memory cells are precharged to a dropped voltage by means of a pulse produced by detecting a change of an input signal and the change of the level of the bit lines is compared with a reference level to read out data.

Hence, a layout of a sense amplifier having a small area can be carried out without giving any excessive stress to the memory cells and which is advantageous to high speed operation of the device.

Further, in the semiconductor memory device of the present invention, a bit line of a reference cell is precharged to the dropped voltage in the same manner as the memory cells and current is applied to the reference cell to generate a reference voltage.

Furthermore, a data latch type sense amplifier is used to achieve much faster operation speed.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor memory device having a plurality of memory cells and a plurality of bit lines, each bit line of said plurality of bit lines being connected to at least one of the plurality of memory cells, comprising:

low voltage means for receiving a power source voltage supplied from outside of said semiconductor memory device, and for producing, in response, a dropped voltage lower than said power source voltage;

precharge means connected to the low voltage means and the memory cells through the bit lines for precharging each of the plurality of bit lines concurrently with one another to the dropped voltage such that said plurality of bit lines are concurrently at said dropped voltage at a selection time;

selection means connected to the memory cells for selecting one of the memory cells at the selection time at which the plurality of bit lines are concurrently at said dropped voltage; and a sense amplifier connected to the memory cells through the bit lines for comparing a level of the bit line of the selected memory cell with a reference level to read out data written in the selected memory cell.

2. A semiconductor memory device according to claim 1, wherein the precharge means includes means for detecting a change of an input level and for generating a pulse signal in response thereto, and precharges the plurality of bit lines to have the dropped voltage concurrently on the basis of said pulse signal.

3. A semiconductor memory device according to claim 1, further comprising a reference level generator for generating the reference level to be sent to the sense amplifier.

4. A semiconductor memory device according to claim 1, further comprising:

a second precharge means connected to the low voltage means and to the sense amplifier through a bit line; and a reference cell connected to the second precharge means through the bit line, wherein the second precharge means precharges the bit line of the reference cell and a voltage of the precharged bit line of the reference cell is connected to the sense amplifier as the reference level.

5. A semiconductor memory device according to claim 1, wherein the sense amplifier includes a latch means for holding the read-out data.

6. A semiconductor memory device according to claim 1, wherein the semiconductor memory device comprises a mask ROM.

7. A mask ROM type semiconductor memory device comprising:

a plurality of memory cells;

a memory cell selecting means for selecting at least one from among said memory cells;

means for generating a reference voltage level;

a sense amplifier having a sense input and having a reference input connected to said reference voltage level and having means for generating an output data signal based on a comparative voltage between said sense input and said reference voltage level;

a plurality of bit lines connected to said plurality of memory cells;

precharging means for receiving an externally supplied power supply voltage and for precharging each of said plurality of bit lines concurrently with one another in response to the externally supplied power supply voltage, so that each of the plurality of bit lines are concurrently at a common reduced voltage when said memory cell selecting means selects one of the memory cells; and means for connecting one of the bit lines corresponding to the selected memory cell to said sense input for comparing a potential level of the corresponding bit line with said reference voltage level to generate said output data therefrom.

8. A semiconductor memory device according to claim 1, wherein said precharge means comprises:

a common precharge control terminal; and a plurality of field effect transistors (FETs), the gate of each of said plurality of FETs being connected to said common precharge control terminal, wherein one of a source and drain of each of said plurality of field effect transistors is connected to said dropped voltage and the other of said source and drain is connected to a corresponding bit line of said plurality of bit lines.

9. A mask ROM type memory device according to claim 7, wherein said precharge means comprises:

a common precharge control terminal; and a plurality of field effect transistors (FETs), the gate of each of said plurality of FETs being connected to said common precharge control terminal, and wherein one of a source and drain of each of said plurality of field effect transistors is connected to said reduced voltage and the other of said source and drain is connected to a corresponding bit line of said plurality of bit lines.

* * * * *